United States Patent [19]
Horiuchi et al.

[11] Patent Number: 5,919,546
[45] Date of Patent: *Jul. 6, 1999

[54] POROUS CERAMIC IMPREGNATED WIRING BODY

[75] Inventors: Michio Horiuchi; Yukiharu Takeuchi, both of Nagano, Japan

[73] Assignee: Shinko Electric Industries Co. Ltd., Nagano, Japan

[*] Notice: This patent is subject to a terminal disclaimer.

[21] Appl. No.: 08/871,419

[22] Filed: Jun. 9, 1997

Related U.S. Application Data

[63] Continuation-in-part of application No. 08/493,616, Jun. 22, 1995, Pat. No. 5,733,640.

[30] Foreign Application Priority Data

Jun. 11, 1996 [JP] Japan ..................................... 8-149006

[51] Int. Cl.$^6$ ................. B32B 3/20; H05K 1/03
[52] U.S. Cl. ...................... 428/131; 428/201; 428/210; 428/209; 428/901; 428/307.3; 428/312.6; 428/317.9; 428/318.4; 174/255; 439/91; 439/68; 439/65; 439/66; 29/878; 29/880; 264/108; 264/42
[58] Field of Search .................... 428/131, 201, 428/210, 209, 901, 307.3, 312.6, 317.9, 318.4; 174/255; 439/91, 68, 65, 66; 29/878, 880; 264/108, 42

[56] References Cited

U.S. PATENT DOCUMENTS

| | | | |
|---|---|---|---|
| 4,387,131 | 6/1983 | Anderson et al. | 428/201 |
| 4,882,455 | 11/1989 | Sato et al. | 174/68.5 |
| 5,116,663 | 5/1992 | Fujimoto et al. | 428/209 |
| 5,229,213 | 7/1993 | Noriuchi et al. | 428/457 |
| 5,464,950 | 11/1995 | Noriuchi et al. | 174/256 |
| 5,604,018 | 2/1997 | Noriuchi et al. | 428/210 |
| 5,686,172 | 11/1997 | Ohya et al. | 428/210 |
| 5,733,640 | 3/1998 | Noriuchi et al. | 428/210 |

*Primary Examiner*—William P. Watkins, III
*Attorney, Agent, or Firm*—Pennie & Edmonds LLP

[57] ABSTRACT

A wiring body, used for manufacturing a substrate, includes a columnar body, having an axis, made of fired porous inorganic insulator impregnated with an organic insulator; and a large number of metallic fine wires embedded in the columnar body in parallel with the axis while the metallic fine wires are arranged at intervals, wherein a ratio of the inorganic insulator in the columnar body is 50 to 80 volume %, preferably 50 to 60 volume %. A method for manufacturing a wiring body includes the steps of charging a dispersed solution, in which inorganic insulating powder is dispersed, into a container in which a number of metallic fine wires are arranged in parallel with the axis, drying the dispersed solution, and firing inorganic insulating powder so that the porosity of the fired body can be in a range from 20 to 50 volume % so as to form a columnar body; and the steps of impregnating the obtained porous columnar body with uncured organic insulating material, and curing the organic insulating material.

10 Claims, 5 Drawing Sheets

POROUS CERAMIC IMPREGNATED WIRING BODY

CROSS-REFERENCE TO RELATED APPLICATIONS

This application is a continuation-in-part of application Ser. No. 08/493,616, filed Jun. 22, 1995, now U.S. Pat. No. 5,733,640.

BACKGROUND OF THE INVENTION

1. Field of the Invention

The present invention relates to a wiring body used for manufacturing a substrate. Also, the present invention relates to such a substrate and a manufacturing method thereof.

2. Description of the Related Art

The present inventors previously invented a method for manufacturing a substrate, having penetrating via conductors, comprising the steps of: arranging a large number of fine metallic wires made of metal such as copper, in a container so that they can be parallel with an axis of the container; charging the container with dispersed solution in which ceramic powder, such as alumina, to be fired at high temperature is dispersed; drying solution in which ceramic powder is dispersed; firing the dried body of ceramic powder at a high temperature at which ceramic powder can be sufficiently densely sintered so as to obtain a dense columnar sintered body, wherein the temperature is not lower than a melting point of the metallic fine wires; and slicing the columnar body perpendicularly to the axis thereof.

According to the above-mentioned method, the metallic fine wires are liquidized in the process of sintering of ceramic powder to be fired at high temperature. Accordingly, even in the case of contraction of a ceramic when it is fired, the metallic fined wires are not cut off, and it is possible to manufacture a substrate having via conductors, the pattern of which is highly dense. It was confirmed by the inventors that the liquidized metallic fine wires are not dispersed in the ceramic.

The present inventors further invented a method for manufacturing a substrate having penetrating via conductors comprising the steps of: arranging a large number of fine metallic wires in a container so that they can be parallel with an axis of the container; charging the container with ceramic powder to be fired at a low temperature, the principal component of which is glass; firing the ceramic powder at a low temperature not higher than a melting point of the metallic fine wires so as to obtain a dense columnar sintered body; and slicing the columnar body perpendicularly to the axis.

According to the above method, ceramic powder to be fired at a low temperature, the principal component of which is glass, is melted in the process of firing. Therefore, no stress is given to the metallic fine wires. Consequently, it is possible to obtain a substrate having via conductors, the metallic wires of which are not cut off.

However, when the former method is employed, the following problems may be encountered. According to the former method, ceramics to be fired at high temperature contract at a high coefficient of contraction of about 40%. Therefore, the dimensional accuracy is lowered. Since ceramic powder is fired to be densified, the hardness of the fired body is very high, so that it is impossible to slice the fired body easily. When an additive is added to a ceramic powder so as to lower the hardness, the mechanical strength is disadvantageously lowered.

When the latter method is employed, the following problems may be encountered. The latter method uses ceramics to be fired at low temperature, the principal component of which is glass. Therefore, the fired body is fragile, and the mechanical strength is not sufficiently high.

SUMMARY OF THE INVENTION

The present invention has been accomplished to solve the above problems. Accordingly, it is an object of the present invention to provide a columnar body for manufacturing a substrate, the dimensional accuracy of which is high and it can be machined easily. Also, it is an object of the present invention to provide a substrate and a method for manufacturing such a substrate with high productivity.

According to the present invention, there is provided a wiring body used for manufacturing a substrate comprising: a columnar body having an axis made of fired porous inorganic insulator impregnated with organic insulator; and a large number of metallic fine wires embedded in the columnar body in parallel with the axis while the metallic fine wires are arranged at intervals, wherein the ratio of the inorganic insulator in the columnar body is 50 volume % to 80 volume %, and the ratio of the inorganic insulator in the columnar body is preferably 50 volume % to 60 volume %.

The columnar body for manufacturing a substrate of the present invention is fired to be porous. Therefore, the hardness is not so high, and it can be machined easily. Accordingly the columnar body can easily be sliced to obtain a substrate. The coefficient of contraction of the columnar body is very low, so that the dimensional accuracy of the via conductor is high. In this connection, an inorganic insulator has a skeleton structure of a continuous phase. Therefore, the inorganic insulator is excellent in mechanical strength.

If the ratio of inorganic insulator is lower than 50 volume %, it is difficult to establish a condition when it is fired, and the porosity fluctuates, which causes a deterioration in reproducibility. When the ratio of inorganic insulator is approximately 60 volume %, contraction seldom occurs in the process of firing, so that the dimensional accuracy is maintained high. When a ratio of inorganic insulator is higher than 80 volume %, density is somewhat increased, and contraction is caused, which causes a problem in dimensional accuracy. In this case, some of the blow holes in the inorganic insulator are not continuous, and some of the resin is not impregnated into the blow holes.

When a rod-shaped body made of ceramic, metal or compound material of ceramic and metal, is embedded in the columnar body in parallel with the axis, it is possible to provide a radiating body for a semiconductor chip in which the ceramic, metal or compound material of ceramics and metal is mounted after the columnar body has been sliced so as to form a substrate.

When penetrating holes are formed in the columnar body in parallel with the axis, these penetrating holes can be made to be a cavity for a semiconductor chip to be mounted in after the columnar body has been sliced so as to form a substrate.

It is preferable that the above inorganic insulating material is one of the fired materials of aluminum oxide, mullite, cordierite, and aluminum nitride.

When the above material is fired, necks are generated between particles of powder. Therefore, the particles of powder are connected with each other, so that a porous fired body can be provided.

The above inorganic insulating material may be a mixed fired material in which glass, the softening point of which is not higher than 1000° C., is mixed with at least one of aluminum oxide, mullite, cordierite, silicon oxide, aluminum nitride, silicon carbide and silicon nitride.

In the case of firing, glass components are connected with particles of ceramic powder, so that the ceramic powder cannot be sintered and the occurrence of contraction can be suppressed.

As an example of the usable organic insulating materials, it is possible to use one of the resins of polyimide, benzocyclobutene, bismaleimidetriazine, epoxy and polyphenylene ether.

Resins of polyimide and benzocyclobutene are excellent in heat resistance.

It is possible to obtain a substrate having a penetrating via conductor when the above wiring body used for manufacturing a substrate is sliced perpendicularly to the axis. The thus obtained substrate has various uses such as a wiring substrate on which semiconductor chips are mounted.

A method for manufacturing a wiring body used for manufacturing a substrate of the present invention comprises:

a first process including the steps of charging a dispersed solution, in which inorganic insulating powder is dispersed, into a container in which a large number of metallic fine wires are arranged in parallel with the axis, drying the dispersed solution, and firing the inorganic insulating powder so that the porosity of the fired body can be in a range from 20 to 50 volume % so as to form a columnar body; and a second process including the steps of impregnating the obtained porous columnar body with uncured organic insulating material, and curing the organic insulating material.

In the first process, it is possible to manufacture a wiring body used for manufacturing a substrate having a radiating body when a rod-shaped body made of ceramics, metal or compound material of ceramics and metal is arranged in the container in conjunction with the metallic fine wires.

In the first process, it is possible to form a penetrating hole in the columnar body when a cylindrical body made of ceramics or metal is arranged in the container in parallel with the axis of the container in conjunction with the metallic fine wires.

It is possible to effectively manufacture a substrate having a penetrating via conductor when the columnar body obtained by the above method for manufacturing a substrate is sliced perpendicularly to the axis.

DESCRIPTION OF THE PREFERRED EMBODIMENTS

Referring to the accompanying drawings, a preferred embodiment of the present invention will now be explained in detail below.

Figure 1:
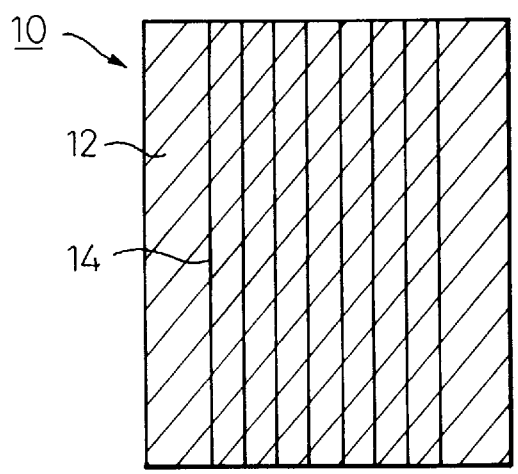
FIG. 1 is a cross-sectional view showing an outline of the first embodiment of the columnar body.

FIG. 1 is a cross-sectional view showing an outline of the columnar body 10 which is a wiring body used for manufacturing a substrate. The columnar body 10 will be explained, as follows, together with a manufacturing method.

Reference numeral 12 is a porous inorganic insulator fired into a columnar shape. Reference numeral 14 is a large number of metallic fine wires made of metal such as copper, aluminum and the like, which are embedded in the inorganic insulator 12 in parallel with the axis.

Figure 2:
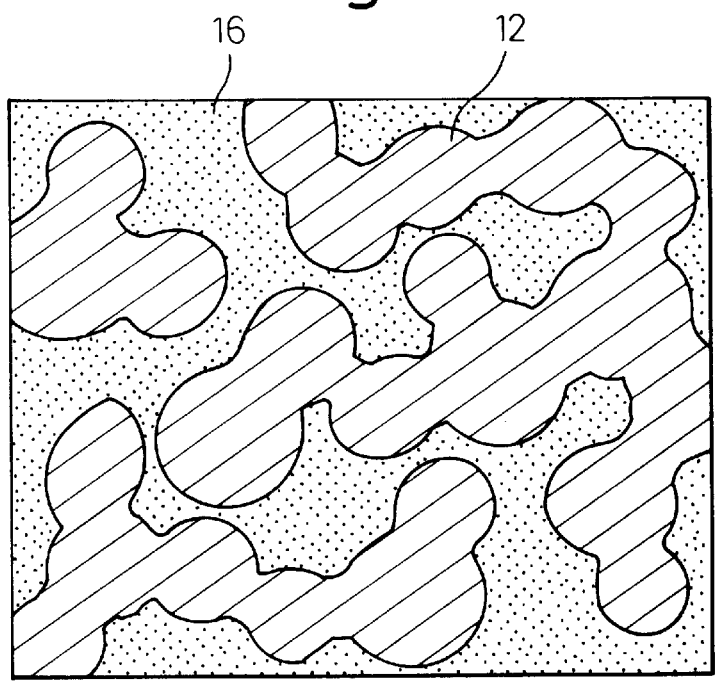
FIG. 2 is a schematic illustration showing an enlarged cross-section of the columnar body shown in FIG. 1.

Organic insulating material 16 shown in FIG. 2 is impregnated into the porous inorganic insulator 12.

Figure 3:
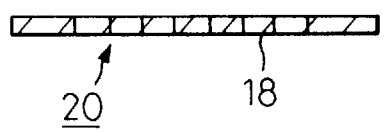
FIG. 3 is a cross-sectional view for explaining a substrate obtained when the columnar body shown in FIG. 1 is sliced.

When the columnar body 10 is sliced by an appropriate thickness perpendicularly to the axis, it is possible to obtain a substrate 20 shown in FIG. 3 having a via conductor 18 in which the metallic fines wires 14 penetrate.

Figure 4:
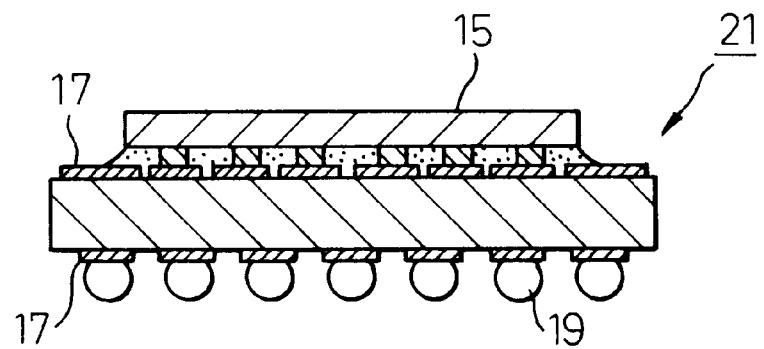
FIG. 4 is a schematic illustration showing a state in which a semiconductor is mounted on a substrate.

Of course, in order to mount a semiconductor chip 15 on this substrate, it is necessary to provide a wiring pattern 17 as illustrated in FIG. 4. Alternatively, when necessary, a dielectric coat (not shown) can be formed on this substrate.

In order to form a wiring pattern 17, the following methods may be employed. One method is described as follows. A coat is formed on the substrate by the thin film method, such as sputtering. After patterning has been conducted, a wiring pattern of predetermined thickness is formed by an additive method. Another method is described as follows. A piece of metallic foil, such as copper foil, is made to adhere onto the substrate so as to conduct patterning.

As described above, it is possible to provide a BGA type semiconductor device 21 when the wiring pattern 17 is formed on the substrate 20, the semiconductor chip 15 is mounted on it, and bumps 19 such as solder balls are formed.

As an example of the usable organic insulating materials 16, it is possible to use one of the resins of polyimide, benzocyclobutene, bismaleimidetriazine, epoxy and polyphenylene ether. Resins of polyimide and benzocyclobutene are excellent in heat resistance.

In order to impregnate the above resin into the inorganic insulator 12, it is necessary to improve the adhesion property to the inorganic insulator 12. Therefore, first, in a condition of reduced pressure, a coupling agent such as a silane coupling agent is impregnated, and then the impregnated coupling agent is substituted by varnish-like resin described before. After that, the resin is cured.

It is preferable that the above inorganic insulating material 12 is made in such a manner that ceramic powder of one of aluminum oxide, mullite, cordierite and aluminum nitride is fired at high temperature As illustrated in the cross-sectional view of FIG. 2, after the columnar body 10 made of ceramic powder to be fired at high temperature has been fired, the columnar body 10 becomes porous, and the void portions are open onto the surface, that is, the columnar body 10 is in a condition of continuous phase, however, there may be a portion containing some closed void portions. In other words, the columnar body 10 is fired so that the ceramic powder to be fired at high temperature cannot be formed into too dense a condition.

It is preferable that a volume % of the inorganic insulating material with respect to the overall composition of the columnar body 12 is 50 to 80%. If a ratio of inorganic insulator is lower than 50 volume %, it is difficult to establish conditions when it is fired, and the porosity fluctuates, which causes a deterioration in reproducibility. When a ratio of inorganic insulator is approximately 60 volume %, contraction seldom occurs in the process of firing, so that the dimensional accuracy is high. When a ratio of inorganic insulator is higher than 80 volume %, density is somewhat increased, and contraction is caused, which causes a problem in dimensional accuracy. In this case, some of the blow holes (voids) in the inorganic insulator are not continuous, and some of the resin is not impregnated into the blow holes.

On the other hand, when a ratio of the inorganic insulating material 12 to the organic insulating material 16 is adjusted, it is advantageous in that the coefficient of thermal expansion, the coefficient of thermal conductivity and the dielectric constant of a substrate can be controlled.

In general, the degree of density of a fired ceramic body is determined by the firing temperature, the firing time and the grain size distribution of powder. In this case, the firing condition is determined in such a manner that the surfaces of ceramic particles are made to be in a glass state, so that the ceramic particles adjacent to each other adhere to each other and neck portions are formed as illustrated in FIG. 2.

The reason why the powder particles are made dense is described as follows. First, powder particles adjacent to each other form neck portions. In accordance with the progress of firing, the adjacent powder particles grow into big particles by the action of surface energy to reduce the surface area.

In the embodiment of the present invention, progress of firing is stopped at a stage before the generation of surface energy by which powder particles are made to grow.

Therefore, in the embodiment of the present invention, the firing temperature is made to be lower than the temperature at which powder particles are made to be dense, and the firing time is shortened, and further the particle size is made to be somewhat large. It is not necessary to consider the particle size distribution. Accordingly, it can be said that the firing condition is relatively simple. Therefore, manufacture of the columnar body 10 is easy.

In the embodiment of the present invention, firing is conducted while the porosity is maintained high. Accordingly, it is possible to suppress the ratio of contraction to very low in the process of firing.

The ratio of contraction can be preferably made to be a value not higher than 1%. It is easy to make the ratio of contraction to be a value not higher than 5%.

Consequently, it is possible to enhance the dimensional accuracy of the substrate 20 when it is cut off from the columnar body 10. Specifically, it is possible to provide a substrate 20, the positional accuracy of the via conductor 18 of which is high.

As compared with a fired ceramic body, the density of which is increased, the hardness of a fired ceramic body of this embodiment is not high. Therefore, slicing can be easily performed with a cutter, and the productivity can be enhanced.

In this embodiment, a slurry-like or paste-like solution in which ceramic powder is dispersed is used for forming a ceramic body to be fired. In order to accomplish the above object, there is prepared a slurry-like or paste-like solution in which ceramic powder (inorganic insulating powder) is dispersed, wherein no organic binder is used or a small quantity of organic binder is used in the slurry-like or paste-like solution. This slurry-like or paste-like solution in which ceramic powder is dispersed is poured into a container 6 in which metallic fine wires 14 are stretched in parallel with each other between an upper 2 and a lower guide plate 4. Then the slurry-like or paste-like solution in which ceramic powder is dispersed is dried. In this way, it is possible to obtain a ceramic body to be fired.

As described above, since no organic binder is used in this embodiment, it is unnecessary to remove an organic binder in the process of firing. Therefore, it is possible to fire a columnar body, the thickness of which is sufficiently large, in a short period of time. For example, it was possible to fire a columnar body, the diameter of which was 10 cm and the height of which was 20 cm, in about 4 hours. Due to the foregoing, the productivity was greatly enhanced.

As compared with the embodiment described above, when an organic binder is used, it becomes necessary to remove the binder in the process of firing. Accordingly, for example, when a green sheet is used, only a thin body, the thickness of which is 3 cm at most, can be fired, because it is impossible to sufficiently remove an organic binder from a thick body.

The metallic fine wires 14 may be made of copper, gold or aluminum.

These metallic fine wires 14 may not be melted in the process of firing the inorganic insulator 12.

The reason why these metallic fine wires 14 may not be melted will be described as follows. Since the inorganic insulator 12 is fired under the condition that it is not contracted (its density is not increased) in the process of firing, there is no possibility that the metallic fine wires 14 are cut off or deformed by the contraction of the inorganic insulator 14 even if the metallic fine wires 14 are not melted.

In this connection, in the case where the metallic fine wires 14 are melted and liquidized, it can be considered that the conductor metal disappears by the evaporation, permeation or diffusion of liquidized metal, or also it can be considered that the metallic fine wires 14 are short-circuited. In order to prevent the evaporation of liquidized metal, an end portion of the ceramic body may be coated with paste or slurry of ceramic before the ceramic body is fired. Concerning the penetration or diffusion of liquidized metal into ceramic, the inventors confirmed that no penetration or diffusion actually occurred.

In this connection, from the viewpoint of reducing the manufacturing cost, it is advantageous that firing is performed in the atmosphere.

According to the investigation made by the inventors, when the metallic fine wires 14 were made of copper, copper oxidizes in the atmosphere. For this reason, it is necessary to conduct firing in a non-oxidizing atmosphere.

When the metallic fine wires 14 were made of aluminum, it was also anticipated that aluminum oxidized in the same manner. Contrary to this anticipation, even when the metallic fine wires 14 were made of aluminum, no oxidation occurred. Oxide film was formed on the surface side of aluminum metallic fine wires 14, however, this oxide film acted as a barrier, so that the advance of oxygen gas into the core was stopped by this barrier. As a result, when the metallic fine wires 14 were made of aluminum, it was possible to conduct firing in the atmosphere, so that the manufacturing cost could be reduced, and no problems were caused in electrical continuity.

Figure 6:
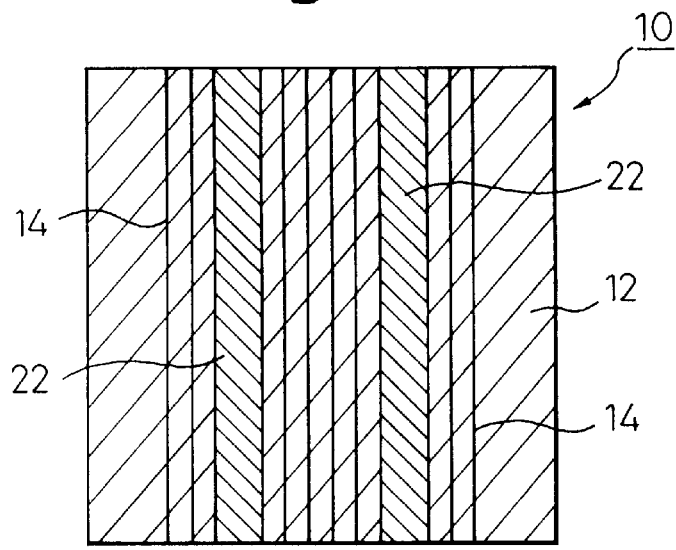
FIG. 6 is a cross-sectional view showing an outline of the second embodiment of the columnar body.

FIG. 6 is a view showing another embodiment of the columnar body 10.

The structure of this embodiment is substantially the same as that of the above embodiment. However, in the structure of this embodiment, not only the metallic fine wires 14 are arranged in the columnar body 10, but also the rod-shaped body 22 having a high radiating property made of ceramics such as aluminum nitride, metal such as copper or compound body composed of ceramics and metal is embedded in the columnar body 10 in parallel with its axis.

Figure 5:
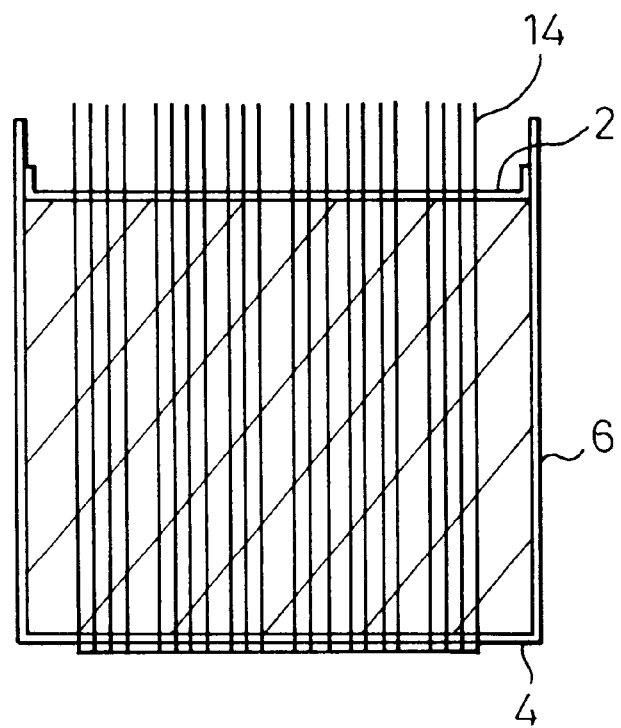
FIG. 5 is a cross-sectional view for explaining a manufacturing apparatus.

In order to obtain the above columnar body 10, of course, the rod-shaped body may be arranged together with the metallic fine wires 14 in the container 6 illustrated in FIG. 5. This arrangement is not shown in the drawing.

Figure 7:
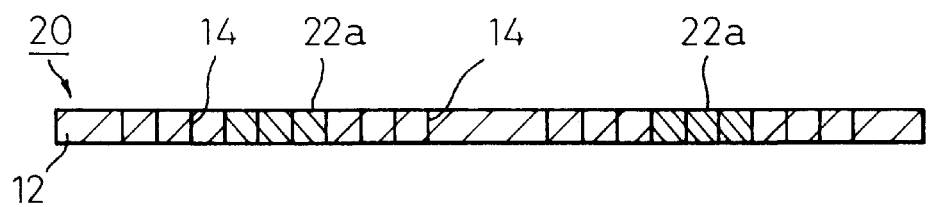
FIG. 7 is a cross-sectional view showing an outline of the substrate obtained when the columnar body shown in FIG. 6 is sliced.

FIG. 7 is a view showing an embodiment in which the above columnar body 10 is sliced with a cutter, to an appropriate thickness, so as to form a substrate 20.

It is possible to mount a semiconductor chip on the radiating body 22a formed when the rod-shaped body 22 is sliced. Due to the foregoing, a substrate 20 having a high radiating property can be provided.

Figure 8:
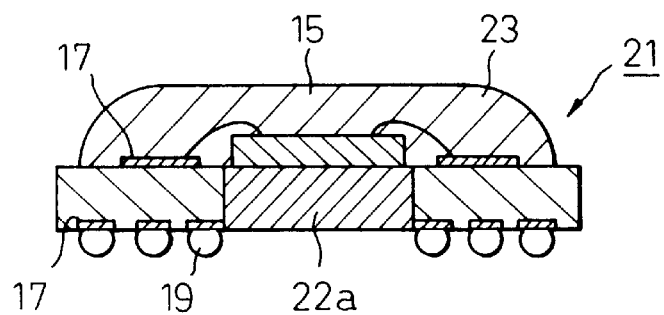
FIG. 8 is a schematic illustration showing a state in which a semiconductor chip is mounted on a substrate.

As illustrated in FIG. 8, it is possible to form a semiconductor device 21 in this embodiment by the same method as that illustrated in FIG. 4. The method is described as follows. The wiring pattern 17 is formed; the semiconductor chip 15 is mounted on the radiating body 22a; the semiconductor chip 15 and the wiring pattern 17 are connected with each other by the wire; the semiconductor chip 15 and the wiring pattern 17 are sealed by sealing resin 23; and the bumps 19 are formed.

In the same manner as that of the embodiments described before, the present invention can be applied to not only a case in which one semiconductor chip is mounted on the substrate 20 but also a case of the substrate used for MCM on which a plurality of semiconductor chips are mounted.

Figure 9:
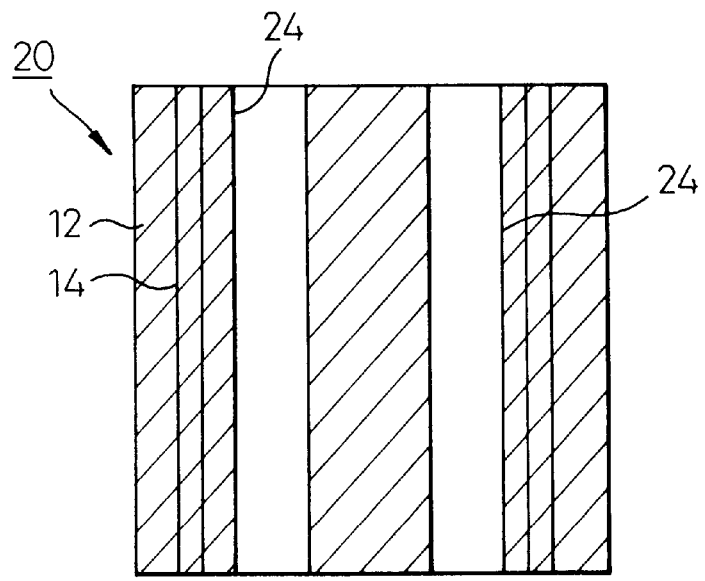
FIG. 9 is a cross-sectional view showing an outline of the third embodiment of the columnar body.

FIG. 9 is a view showing still another embodiment.

The structure of this embodiment is the same as that of the embodiments described before. In this embodiment, not only the metallic fine wires 14 are embedded in the columnar body 10, but also the cylindrical body 24 made of ceramic or metal, the section of which is square or circular, is embedded in the columnar body 10.

In order to obtain the above columnar body 10, the cylindrical body 24 may be arranged together with the metallic fine wires 14 in the container 6, and then they may be fired.

Figure 10:
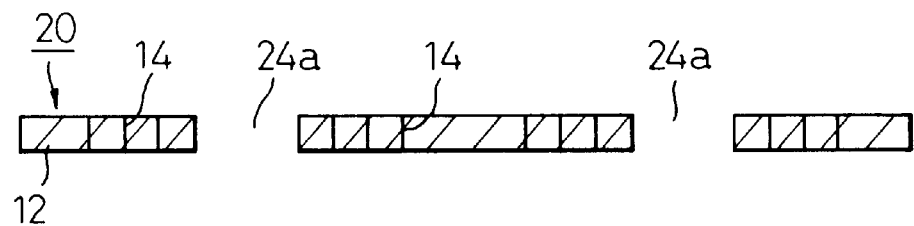
FIG. 10 is a cross-sectional view showing an outline of the substrate obtained when the columnar body shown in FIG. 9 is sliced.

FIG. 10 is a view showing an embodiment in which the above columnar body 10 is sliced with a cutter, to an appropriate thickness, so as to form a substrate 20. Due to the foregoing, it is possible to provide a substrate 20 having through-holes 24a.

In this connection, the cylindrical body 24 may be left as it is. Alternatively, the cylindrical body 24 may be pulled out at an appropriate stage during the manufacturing process. In the case where the cylindrical body 24 is pulled out during the manufacturing process, the through-holes may be formed using a rod-shaped body.

The through-hole 24a can be used as a cavity for the semiconductor chip to be mounted.

That is, a radiating plate is attached onto the substrate 20 in such a manner that the radiating plate covers the through-holes 24a, and the semiconductor chip is mounted on the radiating plate so as to be located in the through-hole 24a.

Figure 11:
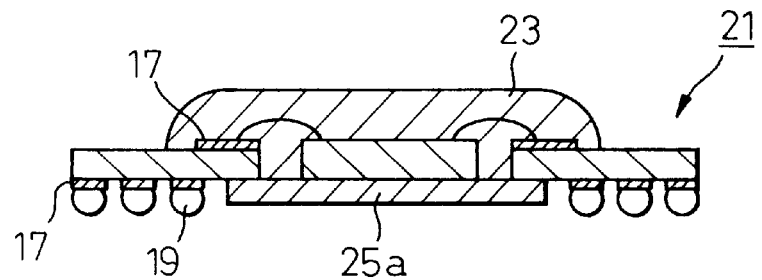
FIG. 11 is a schematic illustration showing a state in which a semiconductor chip is mounted on a substrate.

As illustrated in FIG. 11, in this embodiment it is possible to form a semiconductor device 21 by the same method as that illustrated in FIG. 4. The method is described as follows. The wiring pattern 17 is formed; the semiconductor chip 15 is mounted on the radiating 25a; the semiconductor chip 15 and the wiring pattern 17 are connected with each other by the wire; the semiconductor chip 15 and the wiring pattern 17 are sealed by sealing resin 23; and the bumps 19 are formed.

In each embodiment described above, a ceramic to be fired at high temperature is used as an inorganic insulator. However, the inorganic insulator may be a mixed fired material in which at least one of the following ceramics to be fired at high temperature and glass, the softening point of which is not higher than 1000° C., are mixed. Examples of usable ceramics to be fired at high temperature are: aluminum oxide, mullite, cordierite, silicon oxide, aluminum nitride, silicon carbide and silicon nitride.

In the case of the mixed fired material described above, glass components are melted at low temperature and ceramic powder particles are wetted with the molten glass. Therefore, the ceramic powder particles adhere to each other. As a result, it is possible to conduct firing at a lower temperature.

Figure 12:
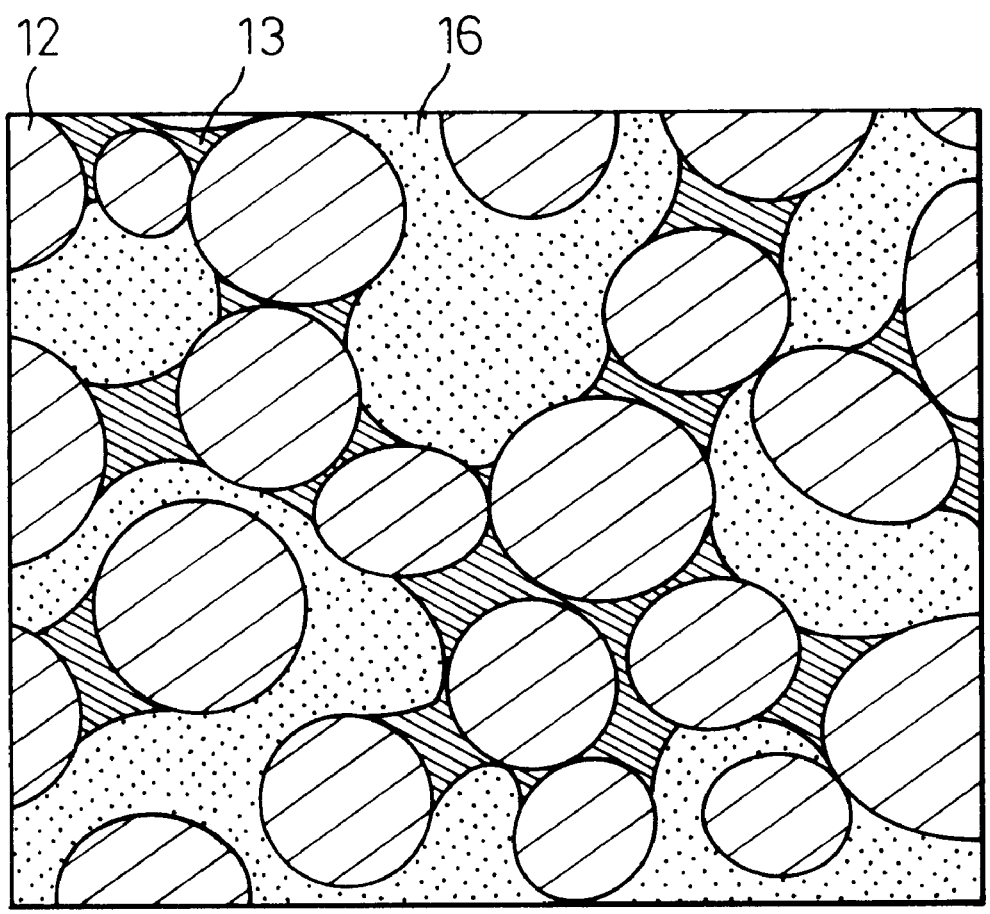
FIG. 12 is a schematic illustration showing an enlarged cross-section of the columnar body in the case where glass components are added.

FIG. 12 is an enlarged cross-sectional view for explaining the columnar body or the substrate of this embodiment. As can be seen in FIG. 12, particles of inorganic insulator (ceramic particles) 12 are connected with each other by the molten glass components 13, so that voids are formed among the ceramic particles. These voids are impregnated with the same resin 16 as that of the embodiment described before. In this way, formation of the columnar body is completed. The thus obtained columnar body is sliced so as to provide a substrate in the same manner as that described before.

In this embodiment, it is possible to suppress a coefficient of contraction. Therefore, it is possible to effectively manufacture a highly accurate columnar body or substrate.

Concerning the glass components 13, as long as they can be sufficiently fluidized, any composition may be adopted. Examples of preferable glass components are: bolosilicate glass, crystallized glass such as $CaO-BaO-SiO_2$, and amorphous glass.

EXAMPLE 1

In Example 1, 50 weight parts of ethanol and 0.1 weight part of surface active agent were added to 100 weight parts of material, the composition of which was aluminum oxide of 50 weight % and glass of $CaO-BaO-SiO_2$ of 50 weight %, the softening point of which was approximately 850° C., and then it was mixed by a ball mill for 20 hours, so that a dispersed solution was obtained.

The thus obtained solution was charged into a cylindrical container made of stainless steel in which copper wires of 0.3 mm diameter were stretched between an upper and a lower wire guide. Then the solution was dried.

After that, firing was conducted in dry nitrogen gas for 1 hour at the maximum temperature of 960° C.

The porosity of the thus obtained fired body was approximately 34%, and the coefficient of contraction was approximately 0.6%.

This fired body was treated in a coupling agent. Then the fired body was impregnated with a mixture containing bisphenol epoxy and hardening agent by the vacuum substitution method. Then the fired body was hardened stepwise at the temperatures of 60° C., 80° C. and 150° C., respectively.

The thus obtained columnar body was sliced perpendicularly to the axis. In this way, a substrate having a via, the thickness of which was approximately 0.7 mm, was obtained.

Next, wiring patterns of copper were formed on both sides of this substrate by the additive method. It was confirmed that a ratio of continuity of the wires on both sides via the substrate was 100%.

When a powder of mullite, cordierite, silicon oxide, aluminum nitride, silicon carbide and silicon nitride was used alone or mixed with each other instead of powder of aluminum oxide, the same effect was provided.

Bolosilicate glass, the softening point of which was approximately 640° C., was used instead of glass of CaO—BaO—$SiO_2$, and the same effect was provided.

Further, when resins of polyimide, benzocyclobutene and bismaleimidetriazine were used instead of epoxy resin of bisphenol, a good result, the same as that described before, was obtained.

EXAMPLE 2

In this example, 50 weight parts of ethanol and 0.1 weight part of surface active agent were added to 100 weight parts of material composed of 90 weight % of aluminum oxide powder and the rest of sintering assistant containing silicon dioxide, calcium carbonate and magnesium oxide. Then, crushing and mixing was conducted by a ball mill for 48 hours. In this way, a dispersed solution was obtained.

The thus obtained solution was charged into a cylindrical container in which copper wires of 0.3 diameter were stretched between an upper and a lower wire guide. Then the solution was dried.

After that, firing was conducted in dry nitrogen gas for 30 minutes at the maximum temperature of 1200° C.

The porosity of the thus obtained fired body was approximately 33%, and the coefficient of contraction was approximately 1.5% in the process of firing.

This fired body was treated in acid and a coupling agent. Then the fired body was impregnated with resin and hardened in the same manner as that of Example 1. The thus obtained columnar body was sliced. Next, wiring patterns of copper were formed on both sides of this substrate. It was confirmed that a ratio of continuity of the wires on both sides via the substrate was 100%.

When powder of mullite, cordierite and aluminum nitride was used instead of powder of aluminum oxide, the same effect was provided.

EXAMPLE 3

In this example, 80 weight parts of ethanol and 0.1 weight part of surface active agent were added to 100 weight parts of material containing 50 weight parts of powder of aluminum nitride and 100 weight parts of powder of bolosilicate glass, the softening point of which was 825° C. Then it was mixed for 20 hours by a ball mill, and a dispersed solution was obtained.

The thus obtained dispersed solution was charged into a cylindrical container made of graphite in which copper wires of diameter of 0.3 mm were stretched between an upper and a lower wire guide and further a nylon rod of diameter of 14 mm was penetrated. Then the dispersed solution was dried, and the nylon rod was pulled out.

After that, firing was conducted in dry nitrogen gas for 1 hour at the maximum temperature of 850° C. The porosity of the thus obtained fired body was approximately 38%, and the coefficient of contraction in the radial direction was approximately 0.3% in the process of firing.

This fired body was treated in a coupling agent of silane and impregnated with a varnish of polyimide by the vacuum substitution method. Then the fired body was subjected to heat treatment at the maximum temperature of 180° C. so as to be hardened.

When the fired body was impregnated with varnish of benzocyclobutene, bismaleimidetriazine, epoxy and polyphenylene ether instead of varnish of polyimide, the same excellent columnar body was provided.

The thus obtained columnar body was sliced in the same manner as that of Example 1, and a substrate having a via and provided with a through-hole was obtained.

EXAMPLE 4

In this example, instead of the nylon rod, the diameter of which was approximately 14 mm, a rod made of aluminum nitride, the diameter of which was approximately the same as that, was used, and the rod made of aluminum nitride was not pulled out even after drying. Except for the above point, the same composition and condition as those of Example 3 were adopted, and a columnar body was obtained.

The thus obtained columnar body was sliced and a substrate of aluminum nitride having a via provided with a through-hole was obtained. After the surface of the substrate had been polished, a titanium layer, the thickness of which was approximately 0.1 $\mu$m, and a copper layer, the thickness of which was approximately 1 $\mu$m, were formed by means of magnetron spattering. After that, a copper layer, the thickness of which was approximately 2 $\mu$m, a nickel layer, the thickness of which was approximately 1 $\mu$m, and a gold layer, the thickness of which was approximately 1 $\mu$m, were formed by means of electrolytic metal plating. Then, etching was conducted so as to form a wiring pattern. It was confirmed that a good continuity was obtained between both surfaces of the substrate. Also, it was confirmed that a good continuity was obtained between the surface of aluminum nitride ceramics and the surface compounded with polyimide.

It should be understood by those skilled in the art that the foregoing description relates to only some preferred embodiments of the disclosed invention, and that various changes and modifications may be made to the invention without departing from the spirit and scope thereof.

We claim:

1. A wiring body for manufacturing a substrate comprising:

a columnar body having an axis and being made of a fired porous inorganic insulator impregnated with an organic insulator; and a number of metallic wires embedded in the columnar body in parallel with the axis with the metallic wires arranged at intervals, wherein the inorganic insulator is present in the columnar body at a ratio of 50 to 80 volume %.

2. A wiring body used for manufacturing a substrate according to claim 1, wherein a rod-shaped body made of ceramic, or metal or a compound body of metal and ceramics is embedded in the columnar body in parallel with the axis.

3. A wiring body used for manufacturing a substrate according to claim 1, wherein a through-hole is formed in the columnar body in parallel with the axis.

4. A wiring body used for manufacturing a substrate according to claim 1, wherein the inorganic insulator is made of one of the fired materials of aluminum oxide, mullite, cordierite, and aluminum nitride.

5. A wiring body used for manufacturing a substrate according to claim 1, wherein the inorganic insulator is a mixed fired material in which glass, the softening point of which is not higher than 1000° C., is mixed with at least one of aluminum oxide, mullite, cordierite, silicon oxide, aluminum nitride, silicon carbide and silicon nitride.

6. A wiring body used for manufacturing a substrate according to claim 1, wherein the organic insulator is one of the resins of polyimide, benzocyclobutene, bismaleimidetriazine, epoxy and polyphenylene ether.

7. A substrate manufactured by the method comprising:

a first process including the steps of charging a dispersed solution, in which inorganic insulating powder is dispersed, into a container having an axis in which a large number of metallic fine wires are arranged in parallel with the axis, drying the dispersed solution, and firing the inorganic insulating powder so that the porosity of the fired body can be in a range from 20 to 50 volume % so as to form a columnar body;

a second process including the steps of impregnating the obtained porous columnar body with uncured organic insulating material, and curing the organic insulating material; and a third step including the step of slicing the columnar body perpendicularly to the axis so as to obtain a substrate having a penetrating via conductor.

8. A wiring body for manufacturing a substrate according to claim 1 wherein the ratio of inorganic insulator in the columnar body is 50 to 60 volume %.

9. A wiring body for manufacturing a substrate according to claim 1 wherein the metallic wires are copper wires each having a diameter of 0.3 mm.

10. A wiring body for manufacturing a substrate according to claim 1 wherein the metallic wires are aluminum.

* * * * *